(12) United States Patent
Adivarahan et al.

(10) Patent No.: US 8,354,687 B1
(45) Date of Patent: Jan. 15, 2013

(54) EFFICIENT THERMAL MANAGEMENT AND PACKAGING FOR GROUP III NITRIDE BASED UV DEVICES

(75) Inventors: Vinod Adivarahan, Irmo, SC (US); Asif Khan, Irmo, SC (US); Qhalid Fareed, Columbia, SC (US)

(73) Assignee: Nitek, Inc., Irmo, SC (US)

( * ) Notice: Subject to any disclaimer, the term of this patent is extended or adjusted under 35 U.S.C. 154(b) by 557 days.

(21) Appl. No.: 12/512,682

(22) Filed: Jul. 30, 2009

Related U.S. Application Data (60) Provisional application No. 61/137,396, filed on Jul. 30, 2008.

(51) Int. Cl.
*H01L 33/38* (2010.01)
(52) U.S. Cl. .................. 257/99; 257/89; 257/E33.068; 438/26
(58) Field of Classification Search .............. 257/89, 257/99, E33.068; 438/26
See application file for complete search history.

(56) References Cited

U.S. PATENT DOCUMENTS

| | | | | |
|---|---|---|---|---|
| 2002/0079502 A1* | 6/2002 | Ishibashi et al. | ............ | 257/89 |
| 2004/0089869 A1* | 5/2004 | Uemura | ............ | 257/85 |
| 2004/0119077 A1* | 6/2004 | Misra et al. | ............ | 257/79 |
| 2004/0217383 A1* | 11/2004 | Krames et al. | ............ | 257/202 |
| 2005/0121685 A1* | 6/2005 | Seong et al. | ............ | 257/99 |
| 2005/0168992 A1* | 8/2005 | Hirose | ............ | 362/296 |
| 2005/0205887 A1* | 9/2005 | Shei et al. | ............ | 257/99 |
| 2006/0202225 A1* | 9/2006 | Kim et al. | ............ | 257/99 |
| 2007/0080420 A1* | 4/2007 | Kim et al. | ............ | 257/466 |
| 2007/0253209 A1* | 11/2007 | Loh et al. | ............ | 362/458 |
| 2007/0284597 A1* | 12/2007 | Nawashiro et al. | ............ | 257/89 |
| 2008/0149961 A1* | 6/2008 | Grillot et al. | ............ | 257/99 |

OTHER PUBLICATIONS

Applied Physics Letters, vol. 81, No. 18, A. Chitnis, et al, Self-heating effects at high pump currents in deep ultraviolet light-emitting diodes at 324 nm; Oct. 28, 2002, pp. 3491-3493.
Japanese Journal of Applied Physics, vol. 43 (2004), No. 11A, Wenhong Sun et al, Continuous Wave Milliwatt Power AlGaN Light Emitting Diodes at 280 nm; pp. 1419-1421.
Journal of Crystal Growth 272 (2004), A.A. Allerman et al, Growth and design of deep-UV (240-290 nm) light emitting diodes using AlGaN alloys, pp. 227-241.
Applied Physics Letters, vol. 85, No. 20, Nov. 15, 2004, K. H. Kim et al, AlGaN-based ultraviolet light-emitting diodes grown on AlN epilayers, pp. 4777-4779.
Japanese Journal of Applied Physics, vol. 42 (2003), Amy Hanlon et al, 292 nm AlGaN Single-Quantum Well Light Emitting Diodes Grown on Transparent AlN Base, pp. 628-4764.

* cited by examiner

*Primary Examiner* — Steven J Fulk
(74) *Attorney, Agent, or Firm* — Joseph T. Guy; Nexsen Pruet, LLC (57) ABSTRACT

A high efficiency light emitting diode with an ultraviolet light-emitting structure. The structure has a first layer with a first conductivity comprising $Al_{1-x-y}In_yGa_xN$ wherein $0 \leq x \leq 1$ and $0 \leq y \leq 1$; a second layer with a second conductivity comprising $Al_{1-x-y}In_yGa_xN$ wherein $0 \leq x \leq 1$ and $0 \leq y \leq 1$; and a light emitting quantum well region between said first layer and said second layer comprising $Al_{1-x-y}In_yGa_xN$ wherein $0 \leq x \leq 1$ and $0 \leq y \leq 1$. The diode also has a carrier bonded to said first layer and said second layer wherein said carrier has a thermal conductivity of at least 100 W/mK and said carrier is resistive between a bonding location of said first layer and a second bonding location of said second layer.

32 Claims, 4 Drawing Sheets

EFFICIENT THERMAL MANAGEMENT AND PACKAGING FOR GROUP III NITRIDE BASED UV DEVICES

CROSS-REFERENCE TO RELATED APPLICATIONS

This application claims priority to pending U.S. Provisional Patent Application No. 61/137,396 filed Jul. 30, 2008 which is incorporated by reference.

BACKGROUND OF THE INVENTION

In recent years, group III-nitride based deep UV light-emitting diodes (LEDs) operating at wavelengths from 250 to 350 nm have attracted growing interest, due to their promise of applicability in various fields including biological agent detection, disinfection, covert communications, optical data storage, and solid state lighting. Several groups including ours have recently reported results for sub-290 nm LEDs grown over sapphire substrates as described in V. Adivarahan, S. Wu, J. P. Zhang, A. Chitnis, M. Shatalov, V. Mandavilli, R. Gaska, and M. Asif Khan, *Appl. Phys. Lett.* 84, 4762 2004; A. J. Fischer, A. A. Allerman, M. H. Crawford, K. H. A. Bogart, S. R. Lee, R. J. Kaplar, W. W. Chow, S. R. Kurtz, K. W. Fullmer, and J. J. Figiel, *Appl. Phys. Lett.* 84, 3394 2004; A. Hanlon, P. M. Pattison, J. F. Kaeding, R. Sharma, P. Fini, and S. Nakamura, *Jpn. J. Appl. Phys.*, Part 2 42, L628 2003; K. H. Kim, Z. Y. Fan, M. Khizar, M. L. Nakarmi, J. Y. Lin, and H. X. Jiang, *Appl. Phys. Lett.* 85, 4777 2004 and A. A. Allerman, M. H. Crawford, A. J. Fischer, K. H. A. Bogart, S. R. Lee, D. M. Follstaedt, P. P. Provencio, and D. D. Koleske, *J. Cryst. Growth* 272, 227 2004.

Recently, device structure and growth optimization efforts have resulted in 280 nm LEDs providing 1 mW of output power at 20 mA of drive current with an external quantum efficiency of 1% as described in W. H. Sun, V. Adivarahan, M. Shatalov, Y. B. Lee, S. Wu, J. W. Yang, and M. Asif Khan, *Jpn. J. Appl. Phys., Part* 2 43 L1419 2004.

In spite of these impressive power numbers, there still is considerable work required to realize high efficiency devices. This not only involves material development, structural improvements, and process optimization but also the realization of robust packaging schemes to provide effective thermal management to allow more efficient device operation and to maintain long-term device performance. There have been various reports on problems with device self-heating effects in packaged III-N deep UV LEDs which lead to the early saturation of optical power as the current was increased, basically corresponding to an increase in device temperature as described in A. Chitnis, S. Jason, V. Mandavilli, R. Pachipulusu, S. Wu, M. Gaevski, V. Adivarahan, J. P. Zhang, M. Asif Khan, A. Sarua, and M. Kuball, *Appl. Phys. Lett.* 81, 3491 2002; A. Sarua, M. Kuball, M. J. Uren, A. Chitnis, J. P. Zhang, V. Adivarahan, M. Shatalov, and M. Asif Khan, *Mater. Res. Soc. Symp. Proc.* 743, L7.8.1 2002 and A. Chitnis, V. Adivarahan, J. P. Zhang, S. Wu, J. Sun, R. Pachipulusu, V. Mandavilli, M. Gaevski, M. Shatalov, and M. Asif Khan, Electron. Lett. 25, 1709 2002.

Removal of by-product heat from a III-nitride light emitting diode and laser diode during operation is important since the lifetime of such a device is a strong function of operating temperature, with an increased operating temperature resulting in a reduced lifetime for the device. For example, the lifetime of a conventional gallium nitride based light emitting diode (LED) and laser diode (LD) will decrease by more than an order of magnitude by rise in temperature. Accordingly, simple heat transfer considerations suggest that a light emitting diode should be in contact with a heat sink material of the highest possible thermal conductivity in order to remove by-product heat as quickly as possible. However, if there is a mismatch between the coefficient of thermal expansion of the light emitting diode and that of the heat sink, the brittle semiconductor diode will experience mechanical stress during operation as a consequence of by-product heat production, and the magnitude of this stress will be a function of the size of the mismatch. Such stress can cause device failure within a few hours if it is severe and uncompensated.

This problem becomes more severe for devices operating deeper in the UV region, especially less than 340 nm, where the external quantum efficiency is typically 1-4% or less. Hence, an effective thermal management system is necessary to ensure efficient heat removal from these LEDs in order to allow operation with sufficiently high bias levels. Earlier studies indicate that flipping the LED chip over and mounting it to the header p-side down greatly improves the transfer of heat away from the junction. Though this is beneficial, the gains with this technique are still inadequate for achieving high efficiency.

Throughout the art amorphous AlN is used as the primary carrier submount. The thermal conductivity of amorphous AlN is typically 70-90 W/mK. The amount of heat generated in the devices flow to submount which then starts to heat up due to conduction. Thus for high power, high current deep UV LEDs it is imperative to improve the heat conduction through these submounts/carriers.

An optimized thermal management and device package mechanism is particularly important for use in the fabrication of highly efficient semiconductor ultraviolet light emitting diodes. Such devices contain a p-n junction which forms a diode, and this junction functions as the active medium of the LED. The efficiency of such light emitting devices in converting electrical power to output optical radiation is relatively high and, for example, can be in excess of 50 percent. However, electrical power which is not converted to light by such a device is lost as heat.

However, for a semiconductor based especially III-N based deep UV LEDs have their efficiency lower in the range of 30-40%. This is primarily due to an increased number of defects for such epilayers. Moreover, due to ineffective doping, the electrical carriers in such epilayers are relatively low as compared with visible LED. Thus, the device possesses higher ON-resistance which then leads to increased device joule heating thus lowering the overall efficiency which is lost as heat. The already lower efficiency and increased generation of heat causes such light emitting diodes with poor overall efficiency in terms of lumens per watt.

It has been an ongoing desire to provide a UV or deep UV LED which is efficient with regards to the lumens per watt. The present invention provides an LED, and method for making the LED, which is highly efficient.

SUMMARY OF THE INVENTION

It is an object of the invention to provide a UV LED which is highly efficient with regards to the lumens per watt.

A feature of the invention is a structure which dissipates heat away from the active regions of the LED and particularly away from the p-junction of the LED.

It is another object of the invention to provide a UV LED which can be utilized in a variety of mounting techniques.

These and other features, as will be realized, are provided in A high efficiency light emitting diode with an ultraviolet light-emitting structure. The structure has a first layer with a first conductivity comprising $Al_{1-x-y}In_yGa_xN$ wherein $0\leq x\leq 1$ and $0\leq y\leq 1$; a second layer with a second conductivity comprising $Al_{1-x-y}In_yGa_xN$ wherein $0\leq x\leq 1$ and $0\leq y\leq 1$; and a light emitting quantum well region between said first layer and said second layer comprising $Al_{1-x-y}In_yGa_xN$ wherein $0\leq x\leq 1$ and $0\leq y\leq 1$. The diode also has a carrier bonded to the first layer and the second layer wherein the carrier has a thermal conductivity of at least 100 W/mK and the carrier is resistive between a bonding location of said the layer and a second bonding location of the second layer.

Yet another embodiment is provided in a method for forming a light emitting diode. The method comprise the steps of:
forming a template;
forming a first layer on the template wherein the first layer has a first conductivity and a composition comprising $Al_{1-x-y}In_yGa_xN$ wherein $0\leq x\leq 1$ and $0\leq y\leq 1$;
forming light emitting quantum well region above the first layer wherein the light emitting quantum well region has a composition comprising $Al_{1-x-y}In_yGa_xN$ wherein $0\leq x\leq 1$ and $0\leq y\leq 1$; and
forming a second layer over the light emitting quantum well with a second conductivity comprising $Al_{1-x-y}In_yGa_xN$ wherein $0\leq x\leq 1$ and $0\leq y\leq 1$;
forming a first-contact layer in electrical connection with the first layer;
forming a second-contact layer in electrical connection with the second layer;
providing a carrier wherein the carrier comprises a first contact zone and a second contact zone; and
bonding the first contact zone to the first-contact layer and the second contact zone to the second contact layer.

DETAILED DESCRIPTION OF THE INVENTION

The instant invention is directed to an improved UV-LED which has improved heat dissipation. The improved heat dissipation increases the efficiency and life time of the UVLED devices as related to the lumens of light generated per watt of power input.

The invention will be described with reference to the figures forming an integral part of the instant application. The drawings are provided for the purposes of describing the invention without limitation thereto. Throughout the description similar elements will be numbered accordingly.

It is well known to those skilled in the art that an active LED comprises semiconducting materials doped with impurities to form a p-n junction. Current flows from the p-side, or anode, to the cathode, or n-side, but not in the reverse direction without a reversal in current. The wavelength of radiation is dependent on the band gap energy of the materials forming the p-n junction. Though not limited thereto the present invention is particularly well suited for use in nitride-based light emitting devices such as Group III-nitride based devices. "Group III nitride" refers to those semiconducting compounds formed between elements in Group III of the periodic table and nitrogen. More preferably, the Group III element is selected from the group consisting of aluminum (Al), gallium (Ga), and/or indium (In). Ternary and quaternary compounds such as AlGaN and AlInGaN are particularly preferred. As is well understood in the art, the Group III elements can combine with nitrogen to form binary compounds such as GaN, AlN and InN; ternary compounds such as AlGaN, AlInN, and GaInN, and quaternary compounds, specifically AlInGaN. In each case the empirical formula is GN wherein G represents a Group III element or mixture of elements or one mole of nitrogen is combined with a total of one mole of the Group III elements. The semiconductor material is not particularly limited herein yet the advantages of the present invention are most readily appreciated in an LED based on Group III nitrides with the most preferable compound being $Al_xIn_YGa_{1-X-Y}N$ wherein $0\leq x\leq 1$, $0\leq y\leq 1$, $0\leq x+y\leq 1$) optionally doped with a material to form an n-type active layer or p-type active semiconductor. Between the n-type and p-type is a quantum well and most preferably a multilayered quantum well which may or may not be doped.

The n-type active layer is preferably doped with n-type dopants such as silicon, indium, oxygen or by simultaneous doping of combinations of these materials. The p-type active layer is preferably doped with p-type dopants such as magnesium, zinc, beryllium or combinations of these materials.

Figure 1:
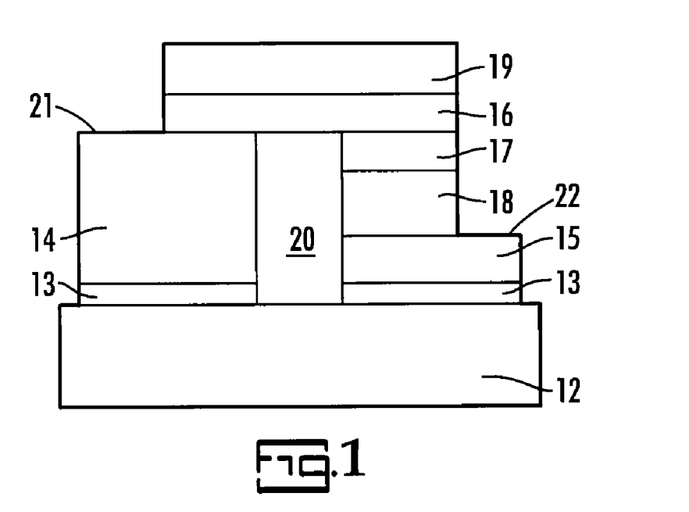
FIG. 1 is a schematic representation of an embodiment of the invention.

An embodiment of the invention is illustrated in schematic view in FIG. 1. In FIG. 1, the UV LED comprises a carrier, 12, which is electrically insulating and thermally conductive. Preferred carriers are selected from materials having a thermal conductivity of at least 100 W/mK and more preferably at least 120 W/mK. Insulating SiC (silicon carbide) is a particularly preferred material for the carrier. Insulating SiC has a thermal conductivity of 120 W/mK and a resistance of $10^5$ $\Omega/cm^2$.

An optional, but preferred, bonding layer, 13, allows subsequent layers to be bonded to the carrier. The bonding layer is a thermally conductive, and optionally electrically conductive, layer such as a metal pad, solder or the like. The bonding layer is a transition layer which provides no function to the LED except to allow the subsequent layers to bond to the carrier. If subsequent layers can be bonded directly to the carrier the bonding layer is not necessary.

The device epilayers of the LED comprise an n-active layer, 16, a multiple quantum well (MQW), 17, and p-active layer, 18. The configuration illustrated is preferred but could be reversed if desired. An n-contact, 14, is in electrical contact with the n-active layer and a p-contact, 15, is in electrical contact with the p-active layer. A template, 19, is provided upon which the active layers are grown as will be further described herein. The n-contact, 14, and p-contact, 15, are bonded to the bonding layer, 13, thereby securing the LED to the carrier. In the embodiment illustrated in FIG. 1 an n-lead, 21, can be bonded to the exposed surface of the n-contact which is parallel to the carrier. Likewise, the p-lead, 22, can be bonded to the exposed surface of the p-contact which is parallel to the carrier. The bonding layer, 13, if conductive, can also be the point of contact for the n-lead and/or p-lead and in one embodiment this is preferred. The carrier must be electrically insulating between the n-contact, 14, and p-contact, 15, to a degree sufficient to avoid an electrical short there between. Throughout the instant specification resistivity of the carrier refers to bulk resistivity as measured from the point of intersection between the n-contact and carrier to the point of intersection between the p-contact and carrier. It is most preferred that a carrier have a resistance of at least $10^5$ $\Omega/cm^2$.

A passivation material, 20, which is preferably a dielectric, is provided within the region bound by the carrier, active layers, and contact layers. The passivation material protects against solder migration between the contact layers during the bonding of the LED to the carrier.

Figure 2:
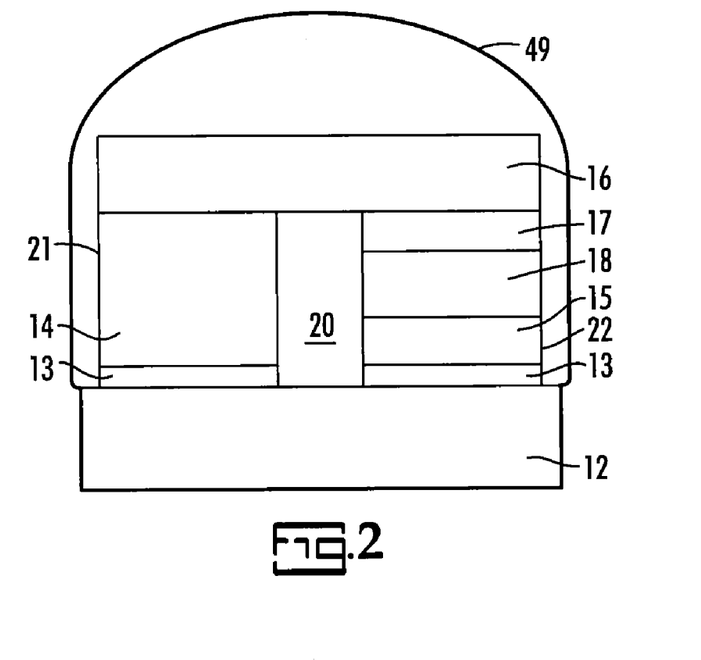
FIG. 2 is a schematic representation of an embodiment of the invention.

Another embodiment of the invention is illustrated in schematic view in FIG. 2. In FIG. 2 the template has been removed thereby further increasing the light emission efficiency since the light is not attenuated by the template. Furthermore, the n-lead, 21, can be bonded to an exposed surface of the n-contact which is not parallel to the carrier and, more preferably, an exposed surface which is perpendicular to the carrier. Similarly, the p-lead, 22, can be bonded to an exposed surface of the p-contact which is not parallel to the carrier and, more preferably, an exposed surface with is perpendicular to the carrier. Reference herein to an exposed surface for bonding the lead refers to a direct electrical contact point for a lead, or lead component, which is available for soldering or otherwise electrically bonding a lead thereto. In a preferred embodiment a dome, 49, of transparent material is formed over at least a portion of the LED for protection purposes. A dome can be formed on a substrate if desired and it may encase the LED allowing for contact between leads and the n-contact and p-contact.

Figure 3:
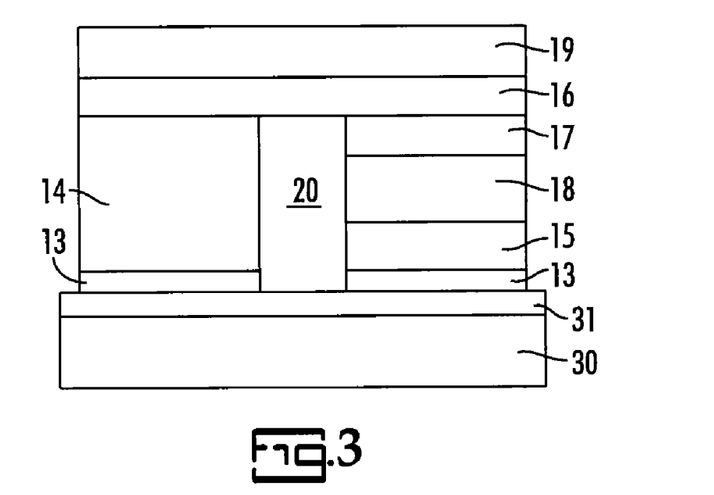
FIG. 3 is a schematic representation of an embodiment of the invention.

Another embodiment of the invention is illustrated in schematic view in FIG. 3. In FIG. 3 the optional bonding layers, 13; n-contact, 14; p-contact, 15; n-active layer, 16; MQW, 17; p-active layer, 18; template, 19; and passivation layer, 20, are as described in FIG. 1. A barrier layer, 31, is provided between at least one optional bonding layer, 13, and the carrier, 30, and is referred to herein as being integral to the carrier. The barrier layer is thermally conductive but electrically insulating. Materials which are suitable for use as a barrier layer include diamond, ceramics such as sintered aluminum nitride, boron nitride, and other high thermally conductive and electrically insulating materials. Most preferably, the barrier layer is diamond. Diamond is electrically insulating and can have a thermal conductivity of as high as 2000 W/mK which is highly desirable. The barrier layer allows the carrier layer, 30, to be a thermally conducting layer without the limitation that the carrier layer also be electrically insulating thereby greatly extending the materials available for use. In this embodiment thermally conducting carrier layers can be selected from a group consisting of Cu, Cu—W, Cu—Mo, copper based alloy or composite material, aluminum based alloy or composite material, Ag, Al, Cr, Pt, Ni, Au, Mo, W, a refractory metal, or a metal alloy thereof. Particularly preferred carrier layers include Cu with a thermal conductivity of 401 W/mK or Cu—W with a thermal conductivity of 215 W/mK. In the embodiment of FIG. 3 the template, 19, may be removed if preferred. Also in the embodiment of FIG. 3 a transparent dome may be formed on the device and may encapsulate at least a portion of the device and preferably the active layers may be encapsulated.

Figure 4:
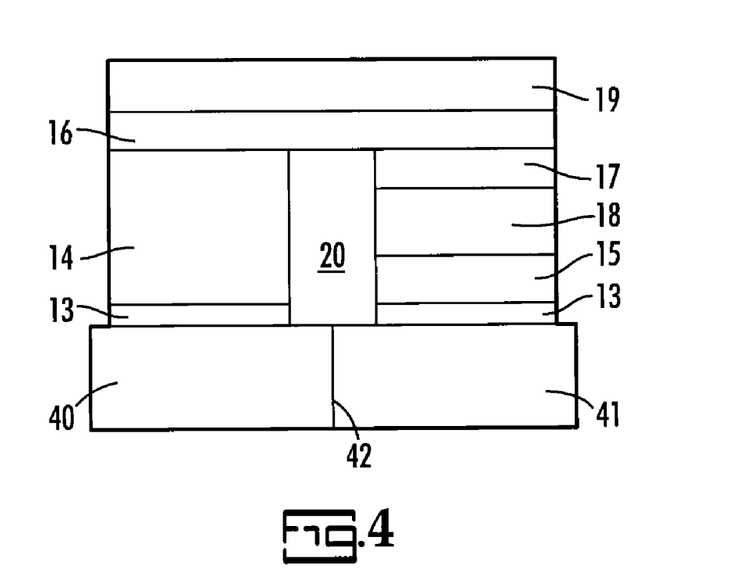
FIG. 4 is a schematic representation of an embodiment of the invention.

Another embodiment is illustrated in FIG. 4. In FIG. 4 the optional bonding layer, 13; n-contact, 14; p-contact, 15; n-active layer, 16; MQW, 17; p-active layer, 18; template, 19; and passivation layer, 20, are as described in FIG. 1.

The carrier of FIG. 4 is distinguished by contact zones. In the embodiment of FIGS. 1-3 the contact zones are indistinguishable zones. In FIG. 4, an n-contact zone, 40, is an electrically insulating zone which may also be thermally conducting. Thermal dissipation from the n-active layer of the LED, though desirable, has been determined to be of less significance than thermal dissipation from the p-active layer of the LED. The n-contact zone can be a ceramic material preferably selected from diamond, ceramics such as sintered aluminum nitride, boron nitride, and other high thermally conductive and electrically insulating materials. A p-contact zone, 41, is a thermally conducting zone and may be electrically conductive. The p-contact zone dissipates heat away from the p-active layers of the LED thereby greatly increasing the efficiency of the LED. The p-contact zone preferably has a thermal conductivity of at least 100 W/mK and more preferably at least 120 W/mK. Particularly preferred materials are selected from a group consisting of Cu, Cu—W, Cu—Mo, copper based alloy or composite material, aluminum based alloy or composite material, Ag, Al, Cr, Pt, Ni, Au, Mo, W, a refractory metal, or a metal alloy thereof. The n-contact zone and p-contact zone are preferably different materials which necessarily creates an interface, 42, between the two zones. Alternatively, an interface may be created to enhance electrical resistance between the zones. In the absence of a barrier layer, as described relative to FIG. 3, the n-contact zone and p-contact zone must be electrically isolated with a resistance between zones sufficiently high to avoid electrical shorts.

A preferred template comprises a substrate. Although preferably made of sapphire, the substrate may be made of silicon carbide, GaN, AlN, AlGaN, InN, InGaN, AlInGaN, Silicon, GaAs, $LiAlO_3$, $LiGaO_3$, ZnO, or a metal. The substrate preferably has a crystallographic orientation along the C-plane, A-plane, M-plane or R-plane and has a mis-orientation ranging from 0.0° to 10° from its axis.

In one embodiment, the template 19 preferably has a first buffer layer which includes at least one strain relief superlattice layer comprising $Al_xIn_yGa_{1-x-y}N/Al_rIn_sGa_{1-r-s}N$, such that $0<x\leq 1$, $0\leq y\leq 1$, $0<x+y\leq 1$ and $0<r\leq 1$, $0\leq s\leq 1$, $0<r+s\leq 1$. The bandgap of the layers in the superlattice should be different and these layers can be deposited either via conventional growth techniques or in a pulsed growth mode in a preferred embodiment.

In a second embodiment, the template 19 preferably consists of at least one layer of $Al_xIn_yGa_{1-x-y}N$ wherein $0<x\leq 1$, $0\leq y\leq 1$, $0<x+y\leq 1$. In one preferred embodiment, the $Al_xIn_yGa_{1-x-y}N$ layer that is used as the sacrificial layer for laser liftoff, also referred to as a lift-off layer, is deposited via pulsed atomic layer epitaxial (PALE) growth, and most preferably it is an aluminum nitride layer. The PALE growth technique greatly improves the quality of the layer by enhancing a two dimensional step-growth mode.

In another embodiment, the template, 19, preferably has two buffer layers on the substrate. One buffer layer is preferably trenched and the second buffer layer is preferably a coalesced planar layer over the first. The coalescing is preferably accomplished by pulsed lateral overgrowth (PLOG) over deep trenches (height$\geq$0.4 μm in case of AlN), or over shallow or deep trenches if the pillars encompass more than one group III species or a combination of multiple layers. The pillars may comprise a multi-layer stack of III-Nitride based semiconductors including AlN, and a strain-relieving superlattice in an array. In some embodiments additional layers are included in the pillars on top of the superlattice including $Al_xIn_yGa_{1-x-y}N$ (wherein $0<x\leq 1$, $0\leq y\leq 1$, and $0<x+y\leq 1$), and additional superlattices with different average composition than the first superlattice. The second buffer layer, of AlN or $Al_xIn_yGa_{1-x-y}N$ (wherein $0<x\leq 1$, $0\leq y\leq 1$ and $0<x+y\leq 1$), is preferably grown by PLOG techniques over the etched pillars preferably until it coalesces to form a planar surface. The ultraviolet light-emitting structure deposited on top of the planar surface on the template is preferably deposited using pulsed atomic lateral epitaxy (PALE) or conventional metallo-organic chemical vapor deposition (MOCVD) deposited AlN, and in some preferred embodiments an additional strain relief superlattice is deposited on the AlN. A thick, preferably ≦1.5 µm, undoped or n-type $Al_xIn_yGa_{1-x-y}N$ (wherein 0<x≦1 and 0≦y≦1, and 0<x+y≦1) layer is deposited next. If the $Al_xIn_yGa_{1-x-y}N$ (wherein 0<x≦1, 0≦y≦1 and 0<x+y≦1) is undoped, an additional n-type $Al_xIn_yGa_{1-x-y}N$ (wherein 0<x≦1 and 0≦y≦1) layer is deposited. This is followed by the quantum well active region and then a p-type $Al_xIn_yGa_{1-x-y}N$ (wherein 0≦x≦1, 0≦y≦1 and 0≦x+y≦1) material is deposited that forms the top electrode for the light emitting device. For convenience the n-type layer is deposed closest to the template. This could be reversed without departing from the scope of the invention.

More specifically, the first buffer layer is preferably etched to form a pattern of trenches with etch depth of greater than or equal to 0.4 µm if the buffer is AlN and the substrate is sapphire, or greater than or equal to 0.1 µm if the first buffer layer consists of one or more AlInGaN layers. After patterning the wafer, a second buffer is preferably applied to the first buffer. In one embodiment the second buffer layer coalesces over the etched portion.

Next, the ultraviolet light-emitting structure is applied to the template. First, a semiconductor layer having a first type of conductivity is applied, followed by several layers forming a quantum-well region with an emission spectrum ranging from 190 nm to 369 nm. Another semiconductor layer, or possibly more than one, having a second type of conductivity is applied next. Two metal contacts are applied to this construction. A leakage suppression layer may be applied to the semiconductor layer having the first type of conductivity and a metal contact is applied to the other semiconductor layer having the second type of conductivity, to complete the LED. Each of these layers will be described in detail below.

Several of the layers and buffer layers are applied using a pulsed atomic layer epitaxy (PALE) growth technique, and the layer grown on the patterned wafer is preferably grown using a pulsed lateral overgrowth (PLOG) technique. Each layer other than the substrate, which is preferably sapphire, is preferably made of a Group III-nitride, preferably $Al_xIn_yGa_{1-x-y}N$ (wherein 0<x≦1, 0≦y≦1 and 0<x+y≦1). In employing pulsed lateral overgrowth techniques, the precursor sources include a metal-organic source (preferably trimethyl aluminum, trimethyl gallium, triethyl gallium, trimethyl indium, ammonia, a carrier gas (such as hydrogen and/or nitrogen) and, optionally, doping sources such as silane, and/or biscyclopentadienyl magnesium.

In some embodiments, it is preferable to etch various layers thereby allowing electrical connectivity. In the embodiment illustrated in FIG. 1, for example, it is preferable to etch to access the n-type layer prior to bonding to the carrier. One method of etching includes the use of reactive ion etching (RIE) to form a portion of the active area containing low-defect density laterally grown "wing" regions. Metal conducting pads may be deposited on both the n+ and p+ layers, respectively, for lead connectivity. Ti/Al/Ti/Au and Ni/Au are exemplary as metal contacts for the n- and p-contacts, respectively, however, the n-metal contacts can be made of Ti, Al, Ni, Au, Mo, Ta or any combination of these metals. The p+ layer contact can be made of Pd, Ni, Ag, Au, ITO, NiO, PdO or any combination of the above-mentioned metals. These contacts could be annealed in air, a forming gas, nitrogen or any combination of such. In one embodiment, the anneal temperature cycle is a single step with a temperature range of 650° C.-950° C. In another embodiment, the annealing cycle may comprise multiple step annealing. The second metal electrode on top of individual pillars is thickened by depositing additional titanium and gold layers. Annealing of the second electrode is done in nitrogen ambient. In another embodiment, the annealing can be done in air, oxygen ambient also.

The passivation material provides two primary advantages. One advantage is as an insulator between the conductors. The second advantage is to fill any voids thereby allowing for a smooth surface across the face after planarization. The passivation material is preferably a material selected from a polymer, more preferably, a non-electrically conducting polymer; and a dielectric. Particularly preferred passivation materials include SU-8 and BCB. Particularly preferred passivating dielectric materials include silicon-dioxide, silicon nitride and silicon oxynitride. The passivation material may be suitably deposited by plasma-enhanced chemical vapor deposition (PECVD) or chemical vapor deposition (CVD).

It is preferable to encapsulate the LED with a transparent material thereby forming a dome over the active layers. The material is chosen to be non electrically conductive and to be transparent to the wavelengths of light emitted by the LED. Epoxies are particularly preferred without limit thereto with silicone epoxies being the most preferred material.

Figure 5A:
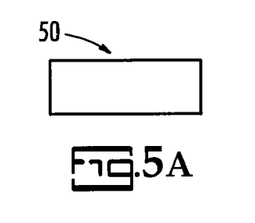
FIG. 5 schematically illustrates a process of the instant invention
Figure 5B:
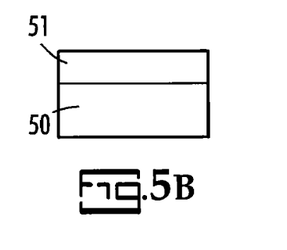

An embodiment of the invention will be described with reference to FIG. 5. In FIG. 5 a schematic representation of the process of manufacturing an LED of the instant invention is provided. In FIG. 5A a substrate, 50, is provided. The substrate is described elsewhere herein with sapphire being most preferred. A first buffer layer, 51, is applied to the substrate, 50, as illustrated at 5B. The first buffer layer may be a series of layers. Adjacent layers may have substantially identical composition or adjacent layers may have compositional changes such as a transition from AlN to AlGaN or similar systematic changes.

Figure 5C:
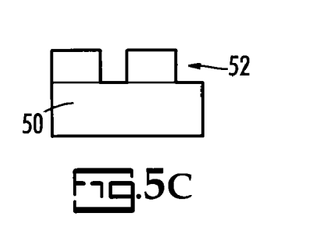

The first buffer layer is etched as illustrated in FIG. 5C to form an etched first buffer layer, 52. Etching may be a partial etching of the first buffer layer or the etching may be to the substrate.

Figure 5D:
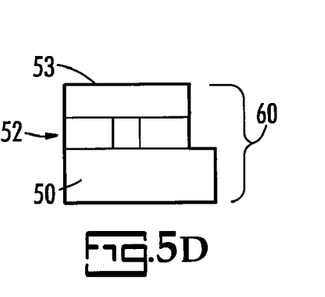

A second buffer layer, 53, is formed over the etched first buffer layer as illustrated in FIG. 5D. The second buffer layer is preferably a coalesced layer over the first buffer region. The second buffer layer may be a series of layers. Adjacent layers may have substantially identical composition or adjacent layers may have compositional changes such as a systematic alteration of the ratio group III elements or similar systematic changes.

Additional layers may be formed prior to the active layers but for the purposes of discussion they are considered part of the template. For the purposes of discussion the layers including the substrate, buffer layers, and any additional layer up the active layer is considered to be taken together as a template, 60.

Figure 5E:
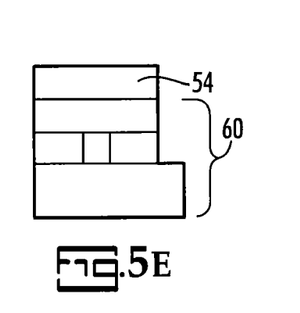

An n-type active layer, 54, is formed over the template, 60, as illustrated in FIG. 5E. The n-type active layer is described elsewhere herein and n-type group III nitride layers are well known to those of skill in the art. Though illustrated as a single layer for convenience purposes it would be understood by those of skill in the art that the n-type layer may have a consistent composition throughout, a continuously altering composition or a composition which changes in stepwise fashion with distance from the template.

Figure 5F:
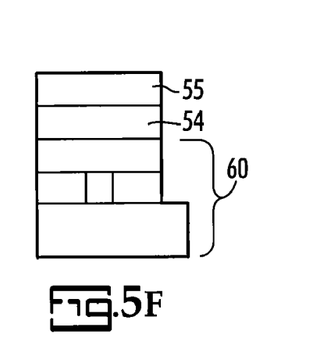

A multiple quantum well, 55, is formed over the n-type layer, 54, as illustrated in FIG. 5F. The multiple quantum well is described elsewhere herein and group III nitride multiple quantum well layers are well known to those of skill in the art. Though illustrated as a single layer for convenience purposes it would be understood by those of skill in the art that the multiple quantum well layer may have a consistent composition throughout, a continuously altering composition or a composition which changes in stepwise fashion with distance from the template.

Figure 5G:
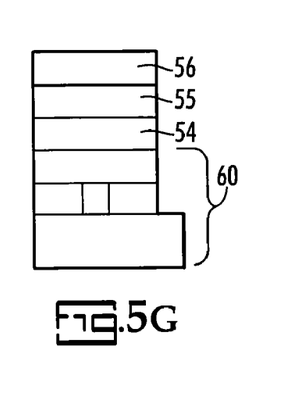

A p-type layer, 56, is formed over the multiple quantum well layer, 55, as illustrated in FIG. 5G. The p-type layer is described elsewhere herein and group III nitride p-type layers are well known to those of skill in the art. Though illustrated as a single layer for convenience purposes it would be understood by those of skill in the art that the p-type layer may have a consistent composition throughout, a continuously altering composition or a composition which changes in stepwise fashion with distance from the template.

Figure 5H:
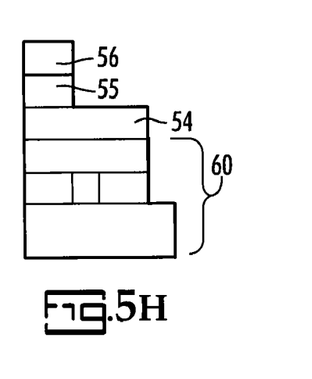

In a preferred embodiment the layers are etched, as illustrated at FIG. 5H, thereby providing access to the n-type layer, 54. Etching is described elsewhere herein and is well known to those of skill in the art. In other embodiments different provisions are made for attaching the leads to the n-type and p-type layers as known in the art.

Figure 5I:
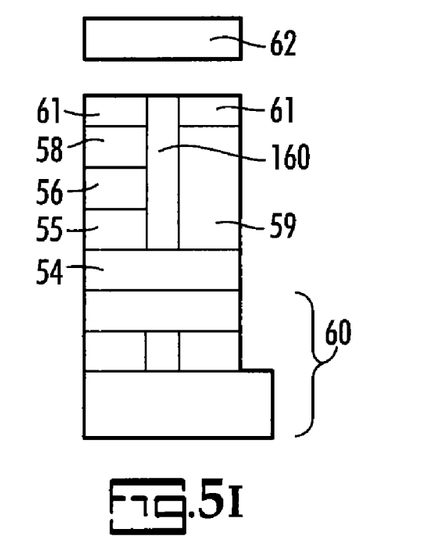
Figure 5J:
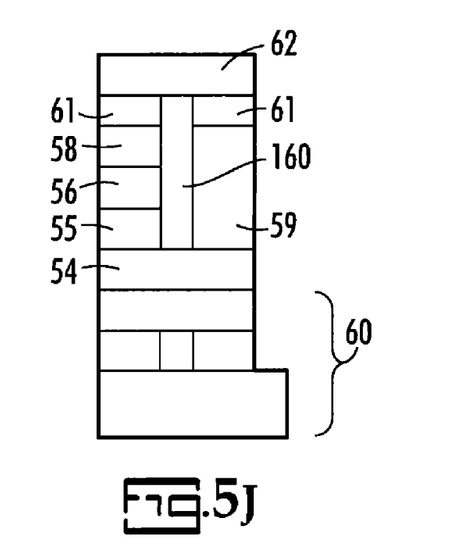

The LED is then prepared for mounting. As illustrated in FIG. 5I, an n-contact layer, 59, is formed on the n-type layer, and a p-contact layer, 58, is formed on the p-type layer. The void is preferably filled with a passivation material, 160. Optional contact layers, 61, are added if necessary and a carrier layer, 62 is bonded to form an LED, 63, as illustrated in FIG. 5J.

Figure 5K:
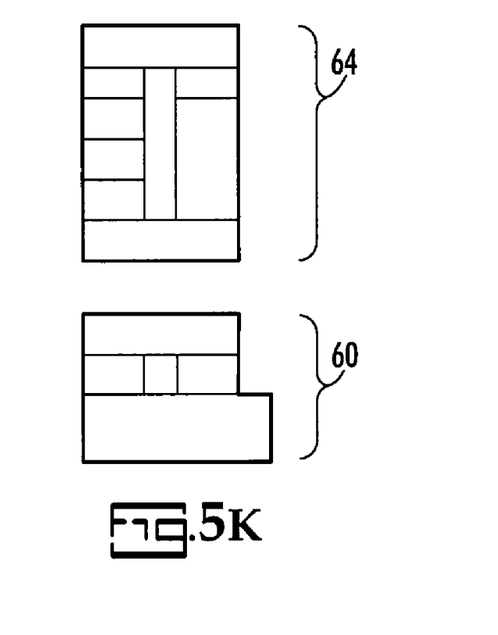

In one embodiment it is preferable to separate the active LED components from the template, 60. As illustrated in FIG. 5K, the template, 60, can be removed thereby forming a high efficiency LED, 64.

The invention has been described with particular reference to the various preferred embodiments without limit thereto. One of skill in the art would readily realize additional embodiments and alterations which are within the scope of the present invention but which are not specifically enumerated herein but are within the scope as set forth in the claims appended hereto.

Claimed is:

1. A high efficiency light emitting diode comprising:
an ultraviolet light-emitting structure comprising:
a first layer with a first conductivity comprising $Al_{1-x-y}In_yGa_xN$ wherein $0 \leq x \leq 1$ and $0 \leq y \leq 1$;
a second layer with a second conductivity comprising $Al_{1-x-y}In_yGa_xN$ wherein $0 \leq x \leq 1$ and $0 \leq y \leq 1$; and
a light emitting quantum well region between said first layer and said second layer comprising $Al_{1-x-y}In_yGa_xN$ wherein $0 \leq x \leq 1$ and $0 \leq y \leq 1$; and
a carrier bonded to said first layer and said second layer wherein said carrier has a thermal conductivity of at least 100 W/mK and said carrier is resistive between a bonding location of said first layer and a second bonding location of said second layer.

2. The high efficiency light emitting diode of claim 1 wherein said carrier has a resistance of at least $1 \times 10^4$ ohms/cm$^2$ between said bonding location and said second bonding location.

3. The high efficiency light emitting diode of claim 1 wherein said bonding location and said second bonding location are the same composition.

4. The high efficiency light emitting diode of claim 1 wherein said carrier has a thermal conductivity of at least 120 W/mK.

5. The high efficiency light emitting diode of claim 1 wherein said carrier comprises a barrier layer between said carrier and at least one of said first layer and said second layer.

6. The high efficiency light emitting diode of claim 5 wherein said barrier layer comprises at least one material selected from the group consisting of diamond, diamond coated material, ceramics such as sintered aluminum nitride, boron nitride, and other high thermally conductive and electrically insulating materials.

7. The high efficiency light emitting diode of claim 6 wherein said barrier layer comprises diamond.

8. The high efficiency light emitting diode of claim 5 wherein said carrier comprises at least one material selected from the group consisting of Cu, Cu—W, Cu—Mo, copper based alloy or composite material, aluminum based alloy or composite material, Ag, Al, Cr, Pt, Ni, Au, Mo, W, a refractory metal, or a metal alloy thereof.

9. The high efficiency light emitting diode of claim 1 wherein said carrier comprises a material selected from the group consisting of diamond, diamond coated material, insulating silicon carbide, aluminum nitride, diamond, insulating silicon, and boron nitride.

10. The high efficiency light emitting diode of claim 9 wherein said carrier comprises insulating silicon carbide.

11. The high efficiency light emitting diode of claim 1 further comprising a template with said ultraviolet light-emitting structure between said template and said carrier.

12. The high efficiency light emitting diode of claim 1 further comprising a interface between said bonding zone and said second bonding location.

13. The high efficiency light emitting diode of claim 12 wherein at least one bonding location comprises a material selected from Ti, Al, Au, Sn, In, Pb, Ni, Mo, V, W, Ta, Pt, Pd, Cr and alloy of Ti, Al, Au, Ni, Mo, V, W, Ta, Pt, Pd, Cr, Sn, In and Pb.

14. The high efficiency light emitting diode of claim 13 wherein said bonding location comprises said material in a stack.

15. The high efficiency light emitting diode of claim 1 further comprising a passivation layer within said ultraviolet light-emitting structure and said passivation layer comprises a material selected from photo-resist, BCB, SU-8 or dielectrics.

16. The high efficiency light emitting diode of claim 15 wherein said dielectric is silicon dioxide or silicon nitride.

17. A method for forming a light emitting diode comprising the steps of:
forming a template;
forming a first layer on said template wherein said first layer has a first conductivity and a composition comprising $Al_{1-x-y}In_yGa_xN$ wherein $0 \leq x \leq 1$ and $0 \leq y \leq 1$;
forming light emitting quantum well region above said first layer wherein said light emitting quantum well region has a composition comprising $Al_{1-x-y}In_yGa_xN$ wherein $0 \leq x \leq 1$ and $0 \leq y \leq 1$; and
forming a second layer over said light emitting quantum well with a second conductivity comprising $Al_{1-x-y}In_yGa_xN$ wherein $0 \leq x \leq 1$ and $0 \leq y \leq 1$;
forming a first-contact layer in electrical connection with said first layer;
forming a second-contact layer in electrical connection with said second layer;
providing a carrier wherein said carrier comprises a first contact zone and a second contact zone; and
bonding said first contact zone to said first-contact layer and said second contact zone to said second contact layer.

18. The method for forming a light emitting diode of claim 17 further comprising removing said template.

19. The method for forming a light emitting diode of claim 17 further comprising forming a passivation layer prior to said bonding.

20. The method for forming a light emitting diode of claim 17 wherein said first contact zone and said second contact zone are the same composition.

21. The method for forming a light emitting diode of claim 17 wherein at least said second zone has a thermal conductivity of at least 120 W/mK.

22. The method for forming a light emitting diode of claim 17 wherein said carrier comprises a barrier layer between said carrier and at least one of said first layer and said second layer.

23. The method for forming a light emitting diode of claim 22 wherein said barrier layer comprises at least one material selected from the group consisting of diamond, diamond coated material, ceramics such as sintered aluminum nitride, boron nitride, and other high thermally conductive and electrically insulating materials.

24. The method for forming a light emitting diode of claim 23 wherein said barrier layer comprises diamond.

25. The method for forming a light emitting diode of claim 22 wherein said carrier comprises at least one material selected from the group consisting of Cu, Cu—W, Cu—Mo, copper based alloy or composite material, aluminum based alloy or composite material, Ag, Al, Cr, Pt, Ni, Au, Mo, W, a refractory metal, or a metal alloy thereof.

26. The method for forming a light emitting diode of claim 17 wherein said carrier comprises a material selected from the group consisting of diamond, diamond coated material, insulating silicon carbide, aluminum nitride, diamond, insulating silicon, and boron nitride.

27. The method for forming a light emitting diode of claim 26 wherein said carrier comprises insulating silicon carbide.

28. The method for forming a light emitting diode of claim 17 with said ultraviolet light-emitting structure between said template and said carrier.

29. The method for forming a light emitting diode of claim 17 further comprising an interface between said first contact zone and said second contact zone.

30. The method for forming a light emitting diode of claim 29 wherein said at least one contact zone comprises a material selected from Ti, Al, Au, Sn, In, Pb, Ni, Mo, V, W, Ta, Pt, Pd, Cr and alloy of Ti, Al, Au, Ni, Mo, V, W, Ta, Pt, Pd, Cr, Sn, In and Pb.

31. The method for forming a light emitting diode of claim 30 wherein at least one contact zone comprises a multi layer stack with each layer of said stack comprising at least one material selected from Ni, Au, Pt, Pd, Ti, Sn, Ag, In, Pb, and alloy of Ni, Au, Pt, Pd, Ti, Sn, Ag, In and Pb.

32. The method for forming a light emitting diode of claim 17 further comprising a passivation layer within said ultraviolet light-emitting structure.

\* \* \* \* \*

UNITED STATES PATENT AND TRADEMARK OFFICE
CERTIFICATE OF CORRECTION

PATENT NO. : 8,354,687 B1
APPLICATION NO. : 12/512682
DATED : January 15, 2013
INVENTOR(S) : Vinod Adivarahan, Asif Khan and Qhalid Fareed It is certified that error appears in the above-identified patent and that said Letters Patent is hereby corrected as shown below:

In all of the following instances listed below, remove $Al_{1-x-y} In_y Ga_x N$ wherein $0 \leq x \leq 1$ and $0 \leq y \leq 1$.
Replace it with $Al_x In_y Ga_{1-x-y} N$ wherein $0 \leq x \leq 1$, $0 \leq y \leq 1$, and $0 \leq x+y \leq 1$ On the Title Page Item (57) Abstract
1. Line 3
2. Line 5
3. Line 7&8

In the Specification
4. Line 1&2 of Column 3
5. Line 3&4 of Column 3
6. Line 5&6 of Column 3
7. Line 15&16 of Column 3
8. Line 19&20 of Column 3
9. Line 22&23 of Column 3

In the Claims
10. Line 40&41 of Column 9
11. Line 43 of Column 9
12. Line 45&46 of Column 9
13. Line 46 of Column 10
14. Line 49&50 of Column 10
15. Line 53 of Column 10

Signed and Sealed this
Second Day of June, 2015

Michelle K. Lee
*Director of the United States Patent and Trademark Office*